(12) United States Patent
Ashida

(10) Patent No.: US 6,630,717 B2
(45) Date of Patent: Oct. 7, 2003

(54) CMOS SEMICONDUCTOR CIRCUIT WITH REVERSE BIAS APPLIED FOR REDUCED POWER CONSUMPTION

(75) Inventor: Tsutomu Ashida, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/846,337

(22) Filed: May 2, 2001

(65) Prior Publication Data

US 2001/0048325 A1 Dec. 6, 2001

(30) Foreign Application Priority Data

May 2, 2000 (JP) ........................................ 2000-133751

(51) Int. Cl.⁷ .......................... H01L 29/76; H01L 29/94; H01L 31/062; H01L 31/113; H01L 31/119
(52) U.S. Cl. ........................ 257/369; 257/350; 257/351; 257/371; 257/372; 257/373; 250/375; 250/376; 250/377
(58) Field of Search ................... 257/350–351, 257/369, 371–377

(56) References Cited

U.S. PATENT DOCUMENTS

| | | | | |
|---|---|---|---|---|
| 4,730,122 A | * | 3/1988 | Dreibalbis et al. | 307/75 |
| 5,359,553 A | * | 10/1994 | Shiomi | 365/189.11 |
| 5,450,027 A | * | 9/1995 | Gabara | 326/98 |
| 5,557,231 A | * | 9/1996 | Yamaguchi et al. | 327/534 |
| 5,675,535 A | * | 10/1997 | Jinbo | |
| 5,703,522 A | | 12/1997 | Arimoto et al. | 327/534 |
| 5,847,581 A | * | 12/1998 | Allen | 326/81 |
| 5,880,604 A | * | 3/1999 | Kawahara et al. | 326/83 |
| 6,060,789 A | * | 5/2000 | Yamaguchi | 307/66 |
| 6,073,238 A | * | 6/2000 | Drupsteen | 713/200 |
| 6,107,836 A | * | 8/2000 | Kawahara et al. | 326/102 |
| 6,107,869 A | * | 8/2000 | Horiguchi et al. | 327/544 |
| 6,184,660 B1 | * | 2/2001 | Hatular | 320/141 |
| 6,265,896 B1 | * | 7/2001 | Podlesny et al. | 326/80 |
| 2002/0043667 A1 | * | 4/2002 | Shibata et al. | 257/202 |
| 2003/0038653 A1 | * | 2/2003 | Ooishi et al. | 326/33 |

FOREIGN PATENT DOCUMENTS

| | | |
|---|---|---|
| EP | 0 986 177 A2 | 3/2000 |
| EP | 1 050 968 A1 | 11/2000 |
| JP | 3-82151 | 4/1991 |
| JP | 9-214321 | 8/1997 |
| JP | 10-189884 A | 7/1998 |
| JP | 10-229165 A | 8/1998 |
| WO | 97/32399 | 9/1997 |

OTHER PUBLICATIONS

Kuroda et al, "A High–Speed Low–Power 0.3 μm CMOS Gate Array with Variable Threshold Voltage (VT) Scheme", Proceedings of the IEEE Custom Integrated Circuits Conference, (CICC), US, New York, vol. CONF. 18, May 5, 1996, pp. 53–56.

* cited by examiner

Primary Examiner—Amir Zarabian
Assistant Examiner—Ida M. Soward
(74) Attorney, Agent, or Firm—Nixon & Vanderhye P.C.

(57) ABSTRACT

An integrated CMOS semiconductor circuit comprises: an internal circuit composed of CMOS transistors including P3- and N-channel transistors each having a gate electrode and source/drain regions formed on a semiconductor substrate, the internal circuit functioning in at least two states including an active state in which data is input and output, and a standby state in which a state of the internal circuit is maintained; an external circuit composed of any electrical element and provided with a power source; and a switch portion which is enable to apply, in the standby state in the internal circuit, a reverse bias between the source and the substrate of either one of the P- and N-channel transistors of the internal circuit by the power source of the external circuit.

15 Claims, 3 Drawing Sheets

Active State   Standby State

CMOS SEMICONDUCTOR CIRCUIT WITH REVERSE BIAS APPLIED FOR REDUCED POWER CONSUMPTION

CROSS-REFERENCE TO RELATED APPLICATION

This application is related to Japanese Patent Application No. 2000-133751 filed on May 2, 2000, whose priority is claimed under 35 USC §119, the disclosure of which is incorporated by reference in its entirety.

BACKGROUND OF THE INVENTION

1. Field of the Invention

The present invention relates to an integrated CMOS semiconductor circuit. More particularly it relates to an integrated CMOS semiconductor circuit applicable for low power consumption-type, battery-operated portable appliances such as information processors (e.g., microprocessors), AV devices, game machines and the like.

2. Description of Related Art

With widespread use of electronic devices for operating portable appliances such as portable telephones, personal digital assistants (PDA), portable information terminals, AV devices and others on batteries, it is becoming more important to decrease both power consumption during operation and power consumption during standby.

High-speed operation at low voltage is enabled by setting a low threshold voltage for MOS transistors. Since the power consumption is proportional to the square of operating voltage, the power consumption during operation can also be reduced.

On the other hand, the power consumption during standby increases where the threshold voltage is set low, because sub-threshold current flows.

In order to solve the above-mentioned problems, Japanese Unexamined Patent Publication No. HEI 3(1991)-082151 proposes a method for decreasing standby current. In this method, the threshold voltage of a MOS transistor is set low for high-speed operation and only during standby, a reverse bias is applied between a source and a substrate (or a well) to raise the threshold voltage of the MOS transistor.

For such application of the reverse bias between the source and the substrate (or the well), there are a method of generating a well potential or a substrate potential within a chip using a well or substrate bias generating circuit and a three power sources method in which two additional power sources are provided for applying two well biases.

Also Japanese Unexamined Patent Publication No. HEI 9(1997)-214321 proposes a method for suppressing a leakage current to a minimum by dynamically controlling the threshold voltage of one type or both types of transistors of a CMOS inverter.

As an example of the aforesaid well or substrate bias generating circuit, a charge pump circuit is mentioned as disclosed in IEEE Journal of Solid-State Circuits, Vol.34, No. 11 Nov. 1999, pp. 1492–1500.

However, in order to operate this charge pump circuit, a power source of about 11 $\mu$A and an area of about 0.14 mm$^2$ are required. Taking the power consumption of the charge pump circuit into consideration, the reduction of the power consumption during standby is limited. As described below, the standby current of a microprocessor with about 4,000,000 elements is about 14 $\mu$A at room temperature. If the threshold voltage of a MOS transistor is raised 0.2 V by applying a reverse bias of 1 V between the source and the well by the charge pump circuit, the standby current decreases by about two digits and becomes smaller than 1 $\mu$A. Thus, the standby current is almost determined by the power consumption of the charge pump circuit. Furthermore, generally, regarding this charge pump circuit, a triple well structure is required for stabilization of operation. This results in a complicated production process and consequently an increase in the cost of production.

In the three power sources method in which two well biases are applied, exclusive-use power sources are added for decreasing the power consumption during standby. That is out of size-, weight- and cost-reduction of battery-operated portable appliances. Also, in this method, the three well structure is required for three power sources.

In order to control the threshold voltage of either one type or both types of transistors of the CMOS inverter, a well or substrate bias generating circuit is also required for applying a bias to control the threshold voltage, in addition to a power source for the CMOS inverter. That gives rise to the same problems as described above. Further, no disclosure is found about adjustment of the threshold voltage of both the types of transistors before the threshold voltage is changed by the application of the bias. If both the types of transistors have equal leakage currents before the bias is applied to the well or substrate of the CMOS inverter, the standby power consumption is not decreased sufficiently by applying the well or substrate bias only to one type of transistors to raise the threshold voltage.

SUMMARY OF THE INVENTION

The present invention has been made in the light of the above-described problems, and an object of the invention is to provide an integrated CMOS semiconductor circuit whose power consumption during standby is decreased without increasing the number of exclusive-use power sources, additionally providing a substrate bias generating circuit which would increase the power consumption and the area of a chip or forming the triple well structure which would make the production process complicated for reducing the power consumption during standby.

The present invention provides an integrated CMOS semiconductor circuit comprising: an internal circuit composed of CMOS transistors including P- and N-channel transistors each having a gate electrode and source/drain regions formed on a semiconductor substrate, the internal circuit functioning in at least two states including an active state in which data is input and output, and a standby state in which a state of the internal circuit is maintained; an external circuit composed of any electrical element and provided with a power source; and a switch portion which is enable to apply, in the standby state in the internal circuit, a reverse bias between the source region and the substrate of either one of the P- and N-channel transistors of the internal circuit by the power source of the external circuit.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
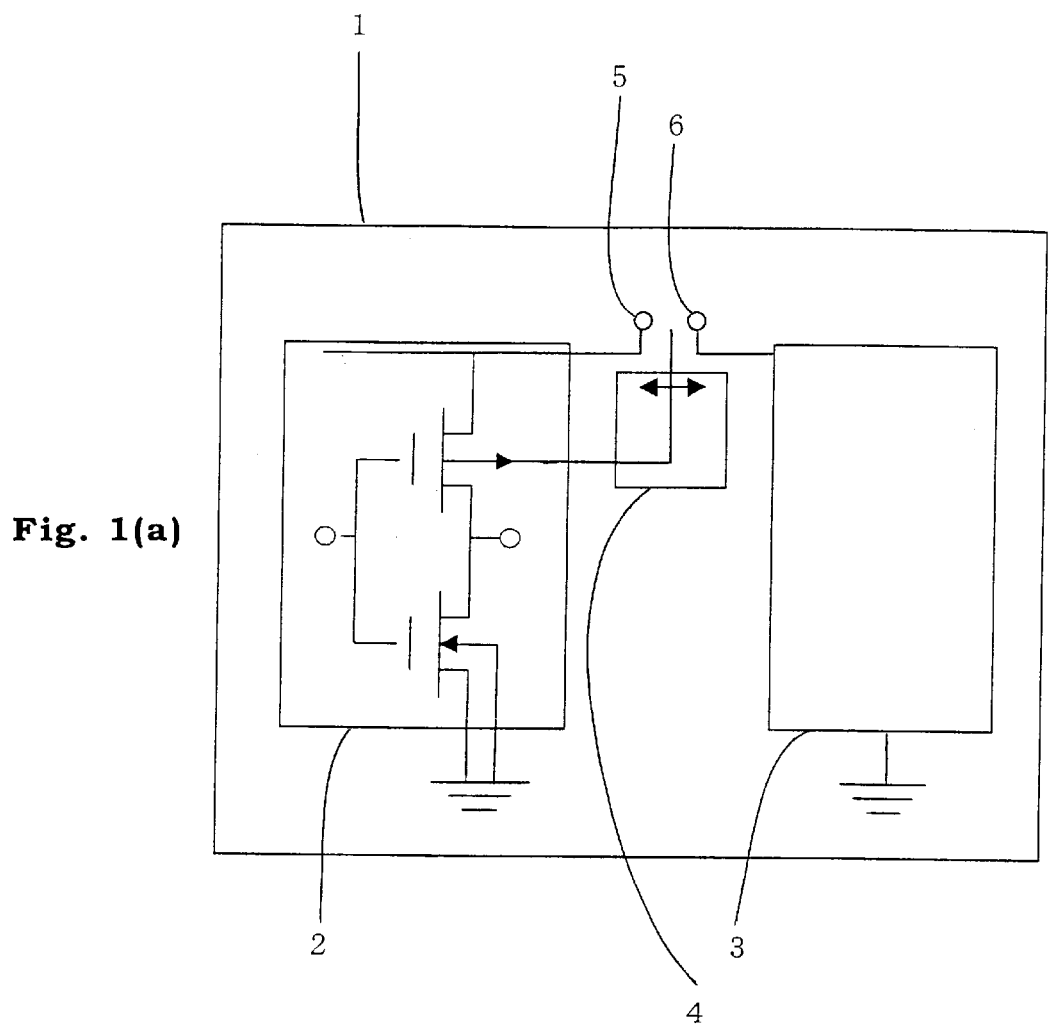
FIGS. 1(a) and 1(b) are block diagrams illustrating an integrated CMOS semiconductor circuit in accordance with the present invention.

The present invention is an integrated CMOS semiconductor circuit which can realize both high-speed operation and low power consumption by receiving different bias voltages in the active state and the standby state of the internal circuit.

The integrated CMOS semiconductor circuit of the present invention is constructed to have at least the internal circuit and the external circuit.

The internal circuit is comprised of CMOS transistor. The CMOS transistors includes P- and N-channel transistors each having a gate electrode and source/drain regions formed on a semiconductor substrate. The construction, action and function of the internal circuit are not particularly limited so long as it functions in at least two states, i.e., the active state in which data is input/output and the standby state in which the internal state is maintained. Generally, the internal circuit may be a circuit required to operate at high speed, a circuit required to consume a low power, especially a circuit required to have a low standby current and the like. More particularly, may be mentioned a CMOS inverter circuit, a logic circuit having a standby mode function, an SRAM, a processor circuit composed of a register, a baseband circuit of a portable telephone and the like. In addition to the active state and the standby state, the internal circuit may have a suspend state which is a long waiting state and needs some time for returning to the active state, an off state in which the circuit is turned off, and the like.

The internal circuit is usually formed on a semiconductor substrate. As the semiconductor substrate, may be used various types of substrates, for example, a substrate of an elementary semiconductor such as silicon, germanium or the like, a substrate of a compound semiconductor such as GaAs, InGaAs or the like. Among them, a substrate of silicon is preferred. Suitably, the semiconductor substrate is relatively low-resistant (e.g., about 20 Ωcm or lower, preferably about 10 Ωcm) with N-type impurities such as phosphorous, arsenic or the like or P-type impurities such as boron doped therein. The semiconductor substrate may have a single well structure in which one or more N-type or P-type impurity diffusion regions (wells) are formed or a double or triple well structure in which a plurality of N-type and P-type impurity diffusion regions (wells) are formed. The impurity concentration in wells may be adjusted as required according to the performance of the transistors or the like. The semiconductor substrate has, for example, semiconductor devices such as a transistor, a capacitor, a resistance and the like, a circuit, an insulating film, a wiring layer and the like formed in combination thereon.

In the CMOS constituting the internal circuit, typically, either or both of P- and N-channel MOS transistors are formed in wells of reverse conductivity type, respectively. Preferably, these MOS transistors are set to have given threshold voltages according to the size, performance and the like of the CMOS transistors, by adjusting the impurity concentration in a surface region of the substrate. For example, both the P- and N-channel transistors of the internal circuit are preferably set to have threshold voltages such that the sum total of leakage currents of either one of the P- and N-channel transistors in the standby state is substantially the same as the sum total of leakage currents of the other of the P- and N-channel transistors in the standby state to which the reverse bias is applied. In addition to the adjustment by the impurity concentration, the threshold voltages can be adjusted as appropriate by applying a reverse bias voltage in the standby state. For example, in the case where a reverse bias of about ±1 V (about +1 V to P-channel MOS and about −1 V to N-channel MOS) is applied to a CMOS obtained by a 0.25 to 0.35 μm (gate length) process, the threshold voltages of the P-channel MOS and the N-channel MOS change by about +0.2 V and by about −0.2V, respectively, and the leakage current decreases by two digits. Thus, especially in the case where both the channel transistors are set to have threshold voltages such that the sum total of leakage currents of either one of the P- and N-channel transistors in the standby state is substantially the same as the sum total of leakage currents of the other of the P- and N-channel transistors in the standby state to which the reverse bias is applied, the leakage currents can be significantly reduced, for example, to about 1/10 or less of the whole internal circuit as compared with the case where the reverse bias is not applied between the source and substrate (or the well) in the standby state.

The internal circuit can be to operate at a relatively low voltage so that the power consumption during operation is reduced. For this purpose, the internal circuit may be typically provided with a power source for the internal circuit. The voltage of the power source for the internal circuit is not particularly limited and may be +0.5 to +5.0 V, for example. More particularly, the power source may be capable of applying about +3.3 V for a MOS transistor whose gate length is about 0.35 μm, about +2.5 V for a MOS transistor whose gate length is about 0.25 μm and about +1.8 V for a MOS transistor whose gate length is about 0.18 μm.

The external circuit is comprised of any electrical element such as transistor, capacitor, resistor or the like. Its construction, action and function are not particularly limited, but is not a bias generating circuit constituted only for applying a well or substrate bias voltage to the internal circuit. The external circuit is a circuit required for allowing the integrated CMOS semiconductor circuit to exhibit its intended function and is different from the internal circuit. For example, the external circuit may be a circuit for driving a liquid crystal device, a non-volatile memory or the like; a circuit required for receiving a relatively high voltage; an input/output circuit connected to a circuit having a high operating voltage; and the like. More particularly, may be mentioned an input/output circuit having a microcomputer function, a processor circuit, an input/output circuit of a baseband of a portable telephone and the like.

Preferably the external circuit is formed on a semiconductor substrate. It may be formed on a substrate different from the substrate on which the internal circuit is formed, but more preferably it is formed on the same substrate that the internal circuit is formed on. The substrate on which the external circuit is formed has, for example, semiconductor devices such as a transistor, a capacitor, a resistance and the like, a circuit, an insulating film, a wiring layer and the like formed in combination thereon.

The external circuit is operated at a relatively high voltage. For this purpose, a power source for the internal circuit may be usually provided. The voltage of the power source for the external circuit is not particularly limited, and for example, it may be about +1.0 V to +15 V, about +2.5 V to +15 V. Its absolute value is required to be set higher than the absolute value of the voltage of the power source for the internal circuit. More particularly, the power source for the external circuit may be capable of applying about ±5.0 V for a MOS transistor whose gate length is about 0.25 to 0.35 μm, and about ±3.0 V for a MOS transistor of the external circuit whose gate length is about 0.18 μm. The voltage of the power source for the external circuit is so set that, in the standby state of the internal circuit, the sum total of leakage currents of either one of the P-channel or N-channel transistors of the internal circuit in the standby state is substantially the same as the sum total of leakage currents of the other of the P-channel and N-channel transistors of the internal circuit whose source and substrate or whose source and well the reverse bias is applied between in the standby state.

In the integrated CMOS semiconductor of the present invention, as described above, a switch portion is preferably formed, for example, as a switch circuit, with the internal circuit and the external circuit. The switch portion means a circuit having a generally called switching function of acting to apply power source for the internal circuit to the internal circuit when the internal circuit is in a state other than the standby state, for example, in the active state, and acting to apply power source for the external circuit to the internal circuit during the standby state in response to a signal indicating the standby state or the change of the internal circuit into the standby state. The construction of the switch circuit may be any one that is usually capable of performing the switching function in the field of semiconductor devices.

In the integrated CMOS semiconductor circuit of the present invention having the above-described construction, in the active state, the internal circuit is supplied with a given voltage from the power source for the internal circuit, thereby functioning to input/output data via the external circuit or other circuit, for example, an input/output circuit. On the other hand, in the standby state, the reverse bias is applied between the source and the substrate (or the well) of either one of the P-channel and N-channel transistors by the power source for the external circuit to which the switch circuit has switches from the power source for the internal circuit.

By thus utilizing the power source for the external circuit, the reverse bias can be applied to an N well or the substrate for the P-channel transistor, or a P well or the substrate for the N-channel transistor (especially the N well for the P-channel transistor), without need to provide the internal circuit with a particular power source for applying the bias to the well or the substrate. That can lead to reduction in the power consumption of the P-channel transistor or the N-channel transistor (especially the P-channel transistor) in the standby state.

An example is now described in which the standby current is reduced by applying the reverse bias between the source and the N well of the P-channel transistor and raising the threshold voltage of the N-channel. However, likewise, the standby current can also be reduced by applying the reverse bias between the source and the P substrate (well) of the N-channel transistor and raising the threshold voltage of the P-channel, by modifying the present invention with use of known techniques of the field of art.

The integrated CMOS semiconductor circuit of the present invention is now explained by way of example thereof with reference to the attached drawings. However, the present invention should not be construed to be limited to the example.

Figure 1B:
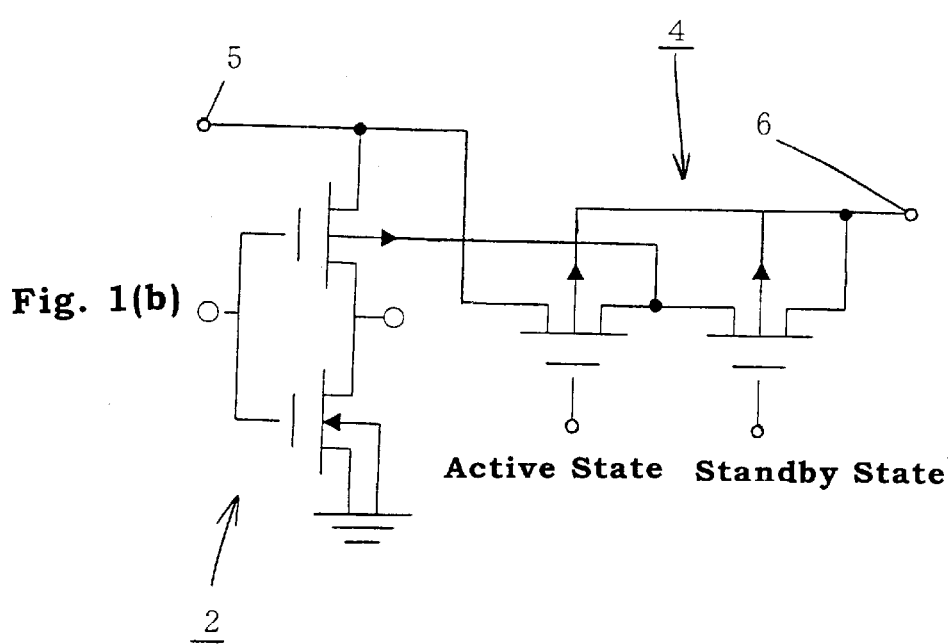

As shown in FIGS. 1(a) and 1(b), an integrated CMOS semiconductor circuit 1 according to the present invention has an internal circuit 2, an input/output circuit 3 as an external circuit, and a switch circuit 4. The internal circuit 2 is comprised, for example, of a CMOS inverter circuit formed in an N-type well and a P-type well. The input/output circuit 3 is also formed in the N-type well and P-type well. The switch circuit 2 is composed of two P-channel transistors.

The internal circuit 2 and the input/output circuit 3 are connected to a power source 5 for the internal circuit and a power source 6 for the external circuit, respectively.

In the active state, 1.6 V is applied to the N well of the internal circuit 2, and 3 V is applied to the N well of the input/output circuit 3.

In the standby state, 3 V is still applied to the N well of the input/output circuit 3. On the other hand, the N well of the internal circuit 2 is supplied with 3 V from the power source 6 for the input/output circuit by switching of the switch circuit 4 in response to a standby signal. Thereby, in the internal circuit 2, the threshold of the P channel transistor in the N well is raised and the standby current decreases.

Generally, the minimum operating voltage Vd of an LSI is defined by:

$$Vd = K(Vtn + |Vtp|) \qquad (1)$$

wherein K is a constant determined by a circuit used, frequency used and the like. Typically, most LSIs have K=1 to 6. Here, is taken as an example an LSI whose K is 1 or more during standby since the LSI does not operate and is 2 during operation with speed, performance and the like taken into consideration. Vtn and Vtp are threshold voltages of the N channel and P channel transistors, respectively.

The standby current Istb of the internal circuit (CMOS inverter) of the LSI as shown in FIGS. 1(a) and 1(b) is represented by:

$$Istb = \alpha \cdot Nn \cdot Wn \cdot Ioffn + |\beta \cdot Np \cdot Wp \cdot Ioffp| \qquad (2)$$

wherein Nn and Np are the numbers of the N-channel and P-channel transistors, respectively, in the internal circuit, and Wn and Wp are average gate widths of the N-channel and P-channel transistors, respectively, in the internal circuit. α and β are compensation terms as to how much leakage currents of transistors affect the standby current, and they depend upon the construction of the circuit.

The calculation of the standby current in the integrated CMOS semiconductor circuit constituted as described above shows, from Formula (1), Vtn=0.39 V at Vd=1.6 V and Vtp=−0.41 V at K=2 during operation.

Figure 2A:
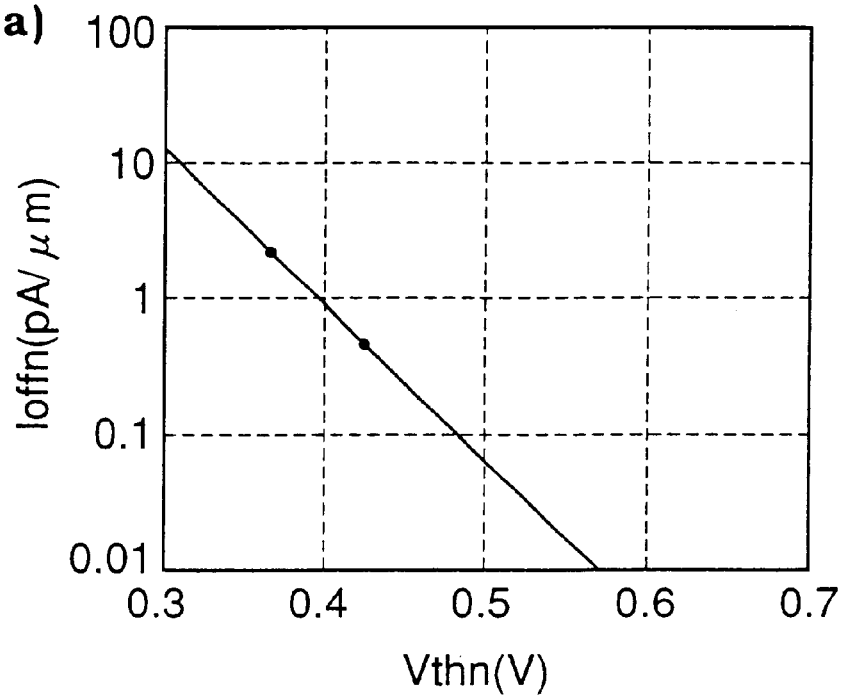
FIGS. 2(a) and 2(b) are graphical representations showing threshold voltage Vth—subthreshold current Ioff characteristics of an N-channel and a P-channel MOS transistor of the present invention.
Figure 2B:
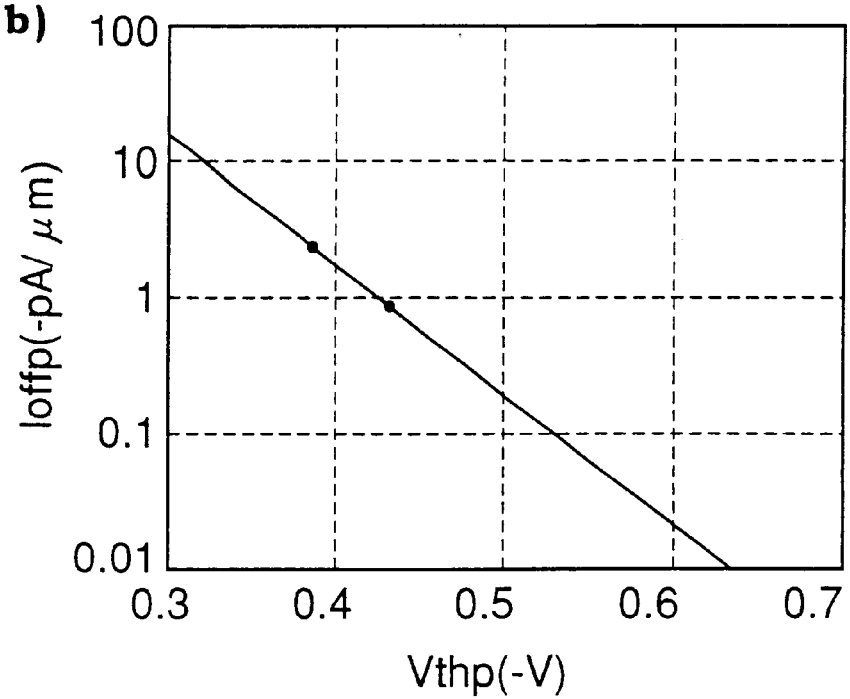

In an NMOS and a PMOS having these thresholds Vtn and Vtp, sub-threshold currents (drain currents) Ioffn and Ioffp at a gate voltage of 0 V are |1.2 pA/μm|, respectively, from FIGS. 2(a) and 2(b). Additionally, FIGS. 2(a) and 2(b) are graphical representations showing threshold Vth—subthreshold current Ioff per the gate width unit characteristics of the N-channel and P-channel MOS transistors, respectively.

From Formula (2), if α and β are each 1, the numbers of the N-channel and P-channel transistors are each 2,000,000 and the average gate width of the transistors is 3 μm, the standby current Istb is 14 μA at room temperature. Actually, it increases further at high temperatures since variations in the threshold need to be considered.

Figure 3A:
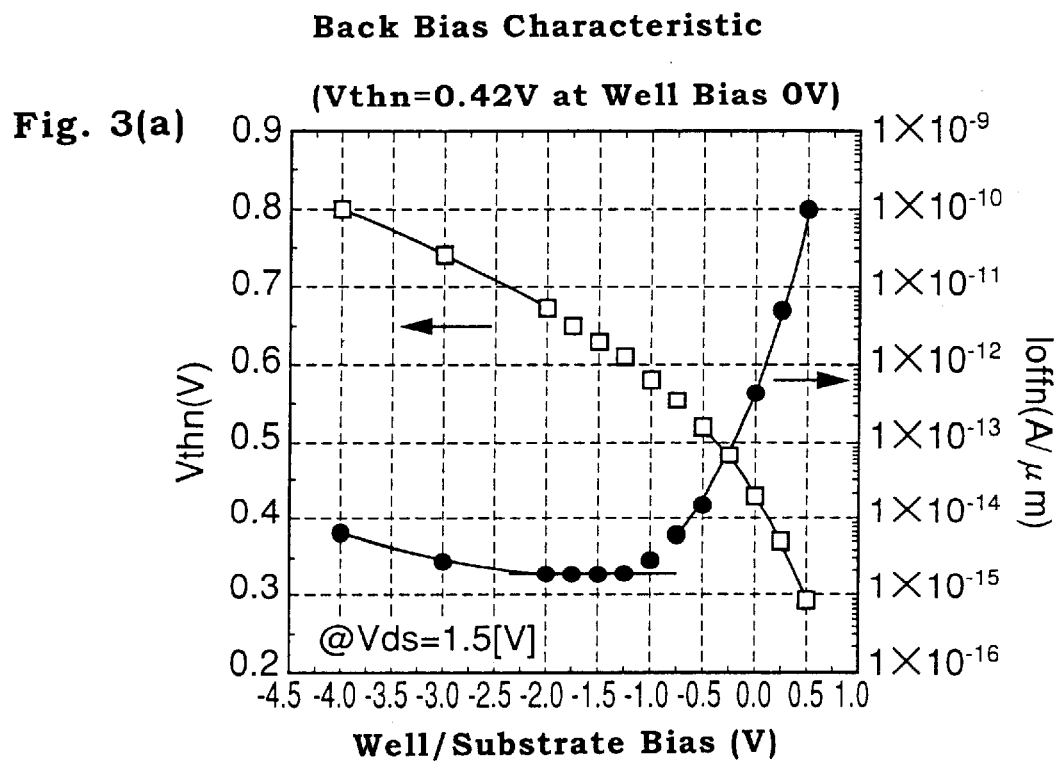
FIGS. 3(a) and 3(b) are graphical representations showing threshold voltage Vth, subthreshold current Ioff—well/substrate bias characteristics of an N-channel and a P-channel MOS transistor on the present invention.
Figure 3B:
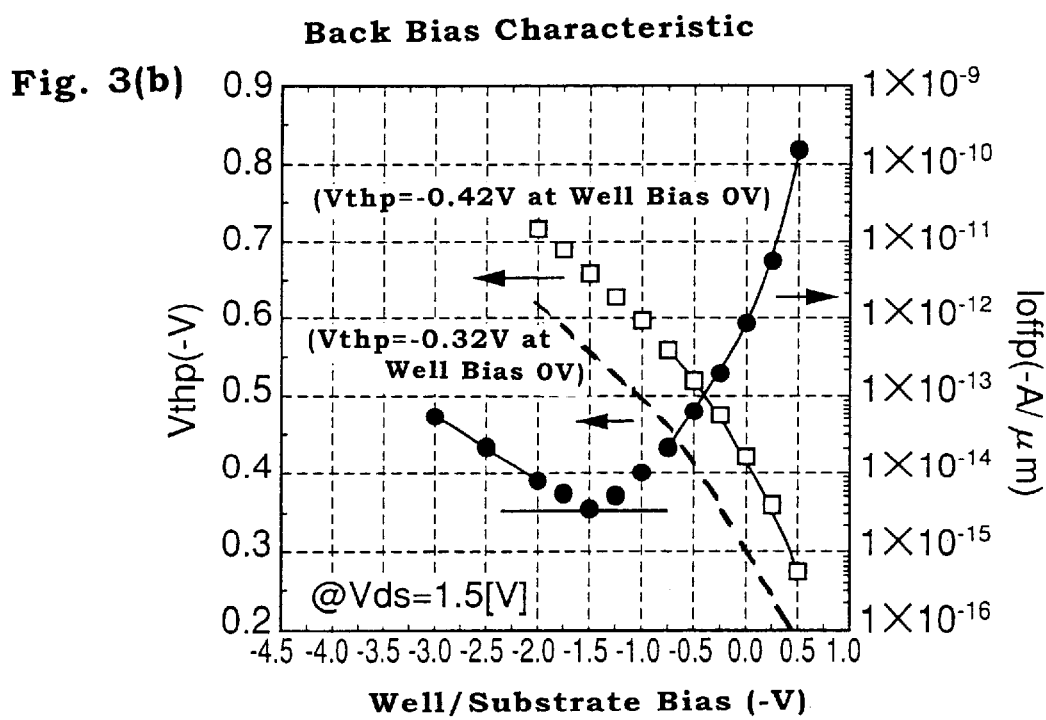

In the standby state, on the other hand, when the voltage applied to the N well of the internal circuit is switched from 1.6 V to 3 V by switching the switching circuit, a reverse bias of 1.4 V is applied between the source and the well of the PMOS transistor in the internal circuit. Thereby, from FIG. 3(b), the threshold voltage of the PMOS transistor decreases by about −0.2 V from about −0.4 V to about −0.6 V. Therefore, the sub-threshold current Ioffp becomes under about −0.01 pA/μm. From Formula (2), the standby current Istb in the internal circuit becomes about 7 μA, which is half of the standby current in the case where the reverse bias is not applied. FIGS. 3(a) and 3(b) are graphical representations showing relationships between the threshold voltage and subthreshold current per unit gate width in the case where the well/substrate bias of the N-channel and P-channel MOS transistors is changed.

In the above-mentioned description, only the standby current of the P-channel transistor is reduced by application of the reverse bias. It is more effective that, in order to reduce the standby current of the internal circuit, the threshold voltage of the N-channel transistor is set higher than that of the P-channel transistor to make equal the leakage current values of both the transistors after the application of the well bias to the N well.

That is, if the threshold voltage of the N-channel transistor is Vtn=0.48 V, Vtp=−0.32 V is obtained from Formula (1) at Vd=1.6 V and K=2. In an NMOS and a PMOS having these thresholds Vtn and Vtp, the sub-threshold current Ioffn at a gate voltage of 0 V is about 0.11 pA/μm from FIGS. 2(a) and 2(b). Ioffp is about −10 pA/μm.

In the standby state, on the other hand, when the voltage applied to the N well of the internal circuit is switched from 1.6 V to 3 V to apply a reverse bias of 1.4 V, the threshold voltage of the PMOS transistor is decreases by about −0.2 V from about −0.32 V to about −0.52 V from FIG. 3(b). Therefore the sub-threshold Ioffp decreases by two digit to −0.11 pA/μm. From Formula (2), the standby current Istb in the internal circuit becomes about 1.3 μA, which is about one eleventh of the standby current in the case where the reverse bias is not applied.

By thus raising the threshold of the N-channel transistor slightly, the standby current of the internal circuit can be decreased further. Vtp at the application of the reverse bias is −0.52 V, but if Vtn=0.48 V is substituted for Formula (2), K=1.6, which is larger than K=1.0. Therefore, during standby, a sufficient margin is maintained for maintaining data.

However, if the threshold voltage of the N-channel transistor is raised, the operation speed is decreased slightly. Since the threshold voltage is decreased in the P-channel transistor, the operation speed is increased. Therefore, in the internal circuit as a whole, variations in the operation speed is negligible.

According to the integrated CMOS semiconductor circuit of the present invention, in the standby state, the reverse bias can be applied to the internal circuit by use of the power source for the external circuit. Therefore, without providing a particular power source for applying the reverse bias, the reverse bias can be applied to the internal circuit, and therefore, the standby current in the internal circuit can be reduced. In other words, by utilizing a power source for a high voltage circuit of the integrated CMOS semiconductor circuit, for example, a power source for an input/output circuit or the like for connection to a liquid crystal device or a non-volatile memory, it is possible to reduce the standby current of the internal circuit without providing a special power source or without using a special charge pump circuit, a bias generating circuit, a triple well structure or the like. Therefore, it is possible to provide an integrated CMOS semiconductor circuit which realizes low power consumption while realizing high-speed operation.

Especially, in the case where the power source for the external circuit is set to have a larger absolute value than the voltage of the power source for the internal circuit; in the case where the voltage of the power source for the external circuit is so set that the sum total of leakage currents of either one of the P- and N-channel transistors in the standby state is substantially the same as the sum total of leakage currents of the other of the P- and N-channel transistors in the standby state to which the reverse bias is applied; in the case where the reverse bias is applied in the standby state with use of the switch circuit responsive to the input of the standby signal; in the case where the threshold voltages of both the P-channel and N-channel transistors are so set that the sum total of leakage currents of either one of the P- and N-channel transistors in the standby state is substantially the same as the sum total of leakage currents of the other of the P- and N-channel transistors in the standby state to which the reverse bias is applied, the reverse bias can be easily applied to the internal circuit. Accordingly, low-priced integrated CMOS semiconductor circuits can be provided, and the standby current can be reduced further.

What is claimed is:

1. An integrated CMOS semiconductor circuit comprising:
    an internal circuit comprising CMOS transistors including P- and N-channel transistors each having a gate electrode and source/drain regions formed on a semiconductor substrate, the internal circuit functioning in at least two states including an active state in which data is input and output, and a standby state in which a state of the internal circuit is maintained;
    an external circuit provided with a power source that supplies power to the external circuit; and
    a switch portion which in the standby state of the internal circuit applies a reverse bias to the internal circuit between the source region and the substrate of one of the P- and N-channel transistors of the internal circuit via the power source of the external circuit, so that power is switched on the substrate side of the one transistor thereby raising a threshold voltage of the one transistor and reducing power consumption.

2. The integrated CMOS semiconductor circuit according to claim 1, wherein the internal circuit is provided with a power source, and a voltage of the power source for the external circuit and thus that for the reverse bias is set higher in absolute value than a voltage of the power source of the internal circuit.

3. The integrated CMOS semiconductor circuit according to claim 2, wherein the voltage of the power source of the internal circuit is in the range of +0.5 to +5.0 V and/or the voltage of the power source of the external circuit is in the range of +1.0 to +15.0 V.

4. The integrated CMOS semiconductor circuit according to claim 1, wherein threshold voltages of both the P- and N-channel transistors of the internal circuit are so set that the sum total of leakage currents of either one of the P- and N-channel transistors in the standby state is substantially the same as the sum total of leakage currents of the other of the P- and N-channel transistors in the standby state to which the reverse bias is applied.

5. The integrated CMOS semiconductor circuit according to claim 1, wherein the voltage of the power source of the external circuit is so set that the sum total of leakage currents of either one of the P- and N-channel transistors in the standby state is substantially the same as the sum total of leakage currents of the other of the P- and N-channel transistors in the standby state to which the reverse bias is applied.

6. The integrated CMOS semiconductor circuit according to claim 1, wherein the internal circuit is a CMOS inverter circuit, a logic circuit having a standby mode function, an SRAM, a processor circuit including a register or a baseband circuit of a portable telephone and personal digital assistant (PDA).

7. The integrated CMOS semiconductor circuit according to claim 1, wherein the external circuit is a circuit for driving a liquid crystal device or a non-volatile memory, a circuit required for receiving a relatively high voltage, an input/output circuit connected to a circuit having a high operating voltage, an input/output circuit having a microcomputer function, a processor circuit or an input/output circuit of a baseband of a portable telephone or personal digital assistant (PDA).

8. The integrated CMOS semiconductor circuit according to claim 1, wherein the switch portion is enabled to respond to input of a standby signal application in order to apply the reverse bias.

9. The integrated CMOS semiconductor circuit according to claim 8, wherein the switch portion has a function of acting to apply power source of the internal circuit to the internal circuit when the internal circuit is in a state other than the standby state, and acting to apply power source of the external circuit to the internal circuit during the standby state in response to a signal indicating the standby state or the change of the internal circuit into the standby state.

10. The integrated CMOS semiconductor circuit according to claim 1, which has a single-, double- or triple-well structure.

11. The circuit of claim 1, wherein the external circuit comprises an input/output circuit.

12. An integrated CMOS semiconductor circuit comprising:
   an internal circuit including at least one transistor having a gate electrode and source/drain regions formed in a semiconductor substrate, the internal circuit including means for functioning in at least an active state in which data is input and output and a standby state in which a state of the internal circuit is maintained;
   an external circuit provided with a power source, the power source for supplying power to the external circuit;
   switching means for applying a reverse bias to the internal circuit during the standby state thereof, wherein the switching means applies the reverse bias to the internal circuit between the source region and the substrate of the transistor via the power source of the external circuit so that power is switched on the substrate side of the transistor thereby changing a threshold voltage of the transistor.

13. The circuit of claim 12, wherein the external circuit comprises an input/output circuit for enabling the circuit to communicate with external devices or systems.

14. The semiconductor circuit of claim 1, wherein the internal circuit comprises first and second transistors whose gates are in communication with one another, and wherein the switch portion is electrically connected to the first transistor but not the second transistor.

15. The semiconductor circuit of claim 12, wherein the internal circuit comprises first and second transistors whose gates are in communication with one another, and wherein the switching means is electrically connected to the first transistor but not the second transistor.

* * * * *